(12) United States Patent
Kimura et al.

(10) Patent No.: US 7,117,462 B2
(45) Date of Patent: Oct. 3, 2006

(54) CIRCUIT OPERATION VERIFYING METHOD AND APPARATUS

(75) Inventors: Tomoo Kimura, Fukuoka (JP);
Tomonori Kataoka, Fukuoka (JP);
Yoichi Nishida, Fukuoka (JP); Ikuo Fuchigami, Fukuoka (JP); Ken Kawai, Osaka (JP); Yasuhiro Ishiyama, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/964,515

(22) Filed: Sep. 28, 2001

(65) Prior Publication Data

US 2002/0040465 A1 Apr. 4, 2002

(30) Foreign Application Priority Data

Sep. 29, 2000 (JP) ...................................... 2000-300119

(51) Int. Cl.
*G06F 17/50* (2006.01)

(52) U.S. Cl. .................................. 716/5; 716/4; 703/14
(58) Field of Classification Search ...................... 716/4, 716/5; 703/14, 15
See application file for complete search history.

(56) References Cited

U.S. PATENT DOCUMENTS

| 5,051,911 A | 9/1991 | Kimura et al. |
| 5,095,454 A | 3/1992 | Huang |

(Continued)

FOREIGN PATENT DOCUMENTS

| JP | 2-144674 | 6/1990 |
| JP | 3-148769 | 6/1991 |
| JP | 5-159017 | 6/1993 |
| JP | 5-303604 | 11/1993 |
| JP | 07-021247 | 1/1995 |
| JP | 7-129656 | 5/1995 |
| JP | 07-260882 | 10/1995 |
| JP | 09-311880 | 12/1997 |
| JP | 9-311880 | 12/1997 |
| JP | 11-175576 | 7/1999 |
| JP | 2000-132578 | * 4/2000 |
| JP | 2000-132578 | 5/2000 |

OTHER PUBLICATIONS

G. Jerke et al., Hierarchical Current Density Verification for Electromigration Analysis in Arbitrarily Shaped Metallization Pattern of Analog Circuits, Proceedings of Design, Automation and Test in Europe Conference, pp. 464–469, Mar. 2002.*

Zebardast et al., SP2V: Accelerating Post–Layout Spice Simulation Using Verilog Gate–Level Modeling, 2001 Canadian Conference on Electrical and Computer Engineering, pp. 253–257, May 2001.*

Naum et al., Automatic Functional Model Validation Between Spice and Verilog, 30th Industry Application Conference, pp. 1076–1083, Oct. 1995.*

*Primary Examiner*—A. M. Thompson
(74) *Attorney, Agent, or Firm*—McDermott Will & Emery LLP

(57) ABSTRACT

In the circuit operation verifying method, initialization includes inputting circuit diagram data (a net list), specification information on respective circuit elements, and input data representing waveforms with time of voltages or currents used for operation simulation, and storing the circuit diagram data to memory. Operation of a semiconductor circuit to be verified is simulated using the circuit diagram data and the input data, and momentary voltage/current values at input terminals and the like of the circuit elements are stored in the memory. During the operation simulation, whether or not the circuit elements satisfy their voltage/current specifications and time specifications are concurrently verified based on the voltage/current values stored in the memory.

11 Claims, 13 Drawing Sheets

U.S. PATENT DOCUMENTS

| | | |
|---|---|---|
| 5,202,841 A | 4/1993 | Tani |
| 5,345,401 A | 9/1994 | Tani |
| 5,471,409 A * | 11/1995 | Tani .............................. 703/14 |
| 5,481,484 A | 1/1996 | Ogawa et al. |
| 5,677,856 A * | 10/1997 | Tani .............................. 703/13 |
| 6,128,768 A * | 10/2000 | Ho ................................ 716/5 |
| 6,577,992 B1 * | 6/2003 | Tcherniaev et al. ........... 703/14 |

* cited by examiner

CIRCUIT OPERATION VERIFYING METHOD AND APPARATUS

BACKGROUND OF THE INVENTION

The present invention relates to a circuit operation verifying method and apparatus for automatically verifying whether or not a number of circuit elements of a semiconductor circuit satisfy respective element specifications determined from device characteristics in circuit design and layout design of the semiconductor circuit.

Conventionally, in LSIs including a flash memory and a liquid crystal driver, an internal voltage higher than a supply voltage is generated using a booster circuit or the like inside the LSI. Using this high voltage, rewrite of data in a flash memory and control of liquid crystal display are performed. In general, a high voltage of +10 to +20 V, for example, is used for an LSI including a flash memory, and a high voltage of +20 V or more is used for an LSI including a liquid crystal driver. An LSI including a flash memory that uses a negative high voltage of about −10 V, for example, is also known. In such an LSI generating a high voltage inside, the internally-generated high voltage is applied to circuit elements such as MOS transistors, capacitances, resistances, and diodes constituting a circuit of the LSI.

In the present semiconductor process technology where semiconductor devices have become finer and thinner, fabrication of semiconductor elements for implementing circuit elements handling a high voltage has become difficult. For example, in an n-channel MOS transistor handling a high voltage, electrons are trapped in a gate oxide film due to a hot electron phenomenon. The hot electron phenomenon occurs because a high voltage is applied to a gate terminal of the MOS transistor when the channel is in the ON state. Once this phenomenon occurs, since the MOS transistor has electrons trapped in the gate oxide film, the channel will not be turned ON easily even when the same gate voltage is applied. This deteriorates the characteristics of the MOS transistor. The hot electron phenomenon may also occur even when a not-so-high gate voltage is applied, depending on the number of times of application and the application time of the gate voltage. In design of LSIs, therefore, the voltage value, the number of times of application, and the application time of the gate voltage must be taken into consideration. If an excessively high voltage is applied, dielectric breakdown occurs, resulting in the LSI itself becoming unusable, as a natural consequence.

Moreover, when a high voltage is used inside an LSI, a large current is generated from a high voltage supply source. If an excessively large current flows to interconnections inside the LSI, electromigration may occur, possibly causing breaking of the interconnections. As another problem occurring due to an excessively large current, heat is generated by power consumption. Temperature rise of the LSI due to the heat generation will further worsen the problems of deterioration in transistor characteristics, electromigration, breakdown of the oxide film, and injection of hot electrons, and will eventually cause a failure of the LSI. The above problem relating to the current and the heat generation is one of the important design challenges the present high-speed operating LSIs have.

As a conventional circuit operation verifying method and apparatus for LSIs, a technique for verifying only the voltage value is proposed in Japanese Laid-Open Patent Publication No. 2000-132578, for example. This conventional technique will be described with reference to FIG. 10.

Referring to FIG. 10, circuit diagram data for which voltage verification is intended and input patterns used for circuit operation simulation are prepared. The circuit diagram data is a net list including information on circuit elements such as transistors, capacitances, and resistances constituting the circuit and information on connection among these circuit elements. The input patterns are patterns of voltages and currents applied to an input terminal and inner nodes (terminals of circuit elements, etc.) of the semiconductor circuit to be analyzed, changing on the time axis. The circuit diagram data and the input patterns are input into a circuit simulator, which executes operation simulation on the time axis and prepares analysis result data. The analysis result data is input into an applied voltage detector denoted by the reference numeral 13 in FIG. 10. Voltage conditions designated in a condition input section and the circuit diagram data described above are also input into the applied voltage detector 13. The detector 13 determines whether the analysis result data satisfies or violates the voltage conditions, to detect a violating circuit element, if 310 any, and display the violating circuit element by spotting on the circuit diagram. This enables the designer to recognize the violating position from the circuit diagram on which the violating circuit device has been spotted, and perform feedback of this violation to the circuit design.

Examining circuit operation on the time axis (in temporal change) described above is called transient analysis. As a circuit operation simulator that performs transient analysis using analog voltage and current values, software called a simulation program with integrated circuit emphasis (SPICE) is generally known. The SPICE is run on a computer such as an engineering work station (EWS) and a personal computer (PC).

FIG. 11 shows a processing flow of transient analysis by the SPICE. Referring to FIG. 11, first, initialization is performed in step Si. FIG. 12 shows details of the initialization, which includes loading circuit diagram data in step S1$a$ (Load schematic net-list), expanding (storing) the circuit diagram data to a memory of a computer in step S1$b$ (Expand schematic to memory), loading input patterns in step S1$c$ (Load stimulus data), and analyzing initial values in step S1$d$ (Computation initialize-point). In this way, voltage and current values at all terminals of circuit elements at time "0", that is, initial voltage and current values are obtained.

Referring back to FIG. 11, in step S2, the time TIME representing the real time in operation simulation is set at "0". The time TIME increases as the simulation proceeds.

Upon completion of the above processing, the process proceeds to step S3, to enter a computation loop of the simulation. Specifically, first in step S3, the voltage and current values at respective nodes stored in the memory of the computer are output to a file in a hard disk (Store outputs). If a node has been designated, the values at this node only, not the values at all nodes, are output. In step S4, whether or not the current time TIME is equal to a simulation end time is determined. If it is equal to the simulation end time, the process is terminated. If not, the process continues and proceeds to step S5. In step S5, a time step value "DELTA" is set at a constant TSEP. The time step value DELTA is a value indicating the amount of progress of the time TIME during the simulation. The constant TSEP is an initial value of the amount of progress. Once the time step value DELTA is determined, the voltage and current values at respective nodes at the time TIME+DELTA are computed in step S6 (Computation). In step S7, whether or not all computation results have converged to give a value is determined. If having converged, the time TIME is updated to TIME+ DELTA, and the process returns to step S3, that is, the start of the computation loop. This series of operation is repeated until the simulation end time comes.

If the computation results have not converged in step S7, the time step value DELTA is reduced according to a given standard in step S9, and the process returns to step S6 to perform the computation again. At this time, however, if the 15 time step value DELTA is found smaller than a predetermined value in step S10, the simulation is forcefully terminated.

The time step value DELTA and the convergence of the computation results will be described with reference to FIG. 13. In FIG. 13, the x-axis represents the time and the y-axis represents the computed voltage or current value. Assume that the operation simulation is now in progress at the time point TIME. Based on the voltage or current value at this time, the voltage or current value at the next time TIME+ DELTA is computed to determine the convergence of the computation results at the time TIME+DELTA. Failure of the convergence is determined (1) when there is a computation gap so large as to greatly influence the simulation precision and (2) when the computation results do not converge at all failing to give any computation results. FIG. 13 shows the case as follows. The computation results did not converge at the time TIME+DELTA. Therefore, the time step value DELTA was reduced to a smaller time step value DELTA', and the voltage or current value at the time TIME+DELTA' was computed. At this time, convergence of the computation results was observed. In this way, the time step value DELTA may be reduced limitlessly if convergence fails. This enhances the computation precision and the degree of convergence, although the progress of the operation simulation becomes slow.

As described above, conventionally, only the verification of voltage conditions is automated. No effective technique has been provided for automatically verifying voltages, currents, and heat generation at design stage. At present, therefore, verification is performed visually by the designer.

However, with the present achievement in scaling-up and complication of circuits, the conventional verifying method described above causes significant decrease in verification precision and lowering in design efficiency.

The conventional voltage verifying method requires two separate process steps of circuit operation simulation and condition verification. Therefore, the time efficiency of the verification work is low.

The analysis result data of the condition verification is data representing temporal transition of voltages and currents at terminals of circuit elements, that is, waveform data along the time axis. Since the size of this data is large, the applied voltage detector 13 shown in FIG. 10 must search the large-size data for a violation position. This increases the searching time. In general, when a semiconductor circuit as the object to be verified is large in scale and when the simulation time is long, the size of analysis result data is large. In view of this, reduction in data size is attempted by outputting as the analysis result data only data at terminals of a circuit element selected among all circuit elements. In this case, the applied voltage detector 13 can only verify the circuit element for which the analysis result data has been output. Full verification is therefore unobtainable. For full verification, a large amount of analysis data is required, and for this purpose, a large size of analysis data must be used, or the condition verification must be repeated a plurality of times. Thus, the conventional voltage verifying method is disadvantageous also in the aspect of work efficiency.

Moreover, the specification conditions for circuit elements include characteristics in which resistance against deterioration is determined by the applied voltage value and the application time, such as oxide film deterioration characteristics. In this case, time conditions defining the voltage application time must be verified in addition to electrical conditions. Conventionally, however, automatic condition verification considering time conditions is not available.

SUMMARY OF THE INVENTION

An object of the present invention is providing a circuit operation verifying method and apparatus capable of automatically verifying voltages, currents, and heat generation at respective elements of a semiconductor circuit at the design stage and attaining high-speed verification of the semiconductor circuit without separating the condition verification from operation simulation of the semiconductor circuit.

Another object of the present invention is to provide automatic condition verification considering time conditions for elements of a semiconductor circuit.

The circuit operation verifying method of the present invention is a circuit operation verifying method for verifying that each of a number of circuit elements of a semiconductor circuit in layout design satisfies specifications. The method includes the steps of: loading condition information as electrical specifications on voltages and currents applied to the circuit elements, circuit diagram data representing connection information of the semiconductor circuit to be verified, and input patterns of voltages and currents used for circuit operation simulation with respect to time; simulating operation of the semiconductor circuit to be verified while computing voltage values or current values with respect to time at the circuit elements of the semiconductor circuit to be verified based on the loaded circuit diagram data and input patterns and storing the computed values in a memory; and verifying that the circuit elements of the semiconductor circuit to be verified satisfy the loaded condition information using the voltage values or the current values at the circuit elements stored in the memory.

In the above circuit operation verifying method, preferably, the condition information includes electrical specifications representing current density values and heat generation amounts of the circuit elements, the circuit diagram data of the semiconductor circuit to be verified includes layout information, and current density analysis and heat generation analysis at positions inside the semiconductor circuit to be verified are performed based on the current values at the circuit elements and the layout information stored in the memory.

In the above circuit operation verifying method, preferably, the condition information includes time specifications representing the frequency of violation against the electrical specifications or the time period for which a violation state is allowable, and whether or not the frequency of violation or the violation allowable time period of each of the circuit elements of the semiconductor circuit to be verified satisfy the time specifications is verified using the voltage values or the current values with respect to time at the circuit element stored in the memory.

In the above circuit operation verifying method, preferably, upon termination of the operation simulation and the condition verification of the semiconductor circuit to be verified, results of the condition verification are displayed on a waveform display apparatus displaying results of the operation simulation or a design apparatus used for circuit design or layout design of the semiconductor circuit.

In the above circuit operation verifying method, preferably, a verification period during which the condition verification is to be executed for the semiconductor circuit to be verified or a non-verification period during which no condition verification is to be executed is designated, and the condition verification for the semiconductor circuit to be verified is executed during the verification period, or no condition verification for the semiconductor circuit to be verified is executed during the non-verification period.

In the above circuit operation verifying method, preferably, the specifications in the condition information are commonly designated for all the circuit elements of the semiconductor circuit to be verified, or individually designated for the respective circuit elements.

In the above circuit operation verifying method, preferably, low-precision, high-speed operation simulation is executed for the semiconductor circuit to be verified using the input patterns, to prepare operation information on the circuit elements of the semiconductor circuit to be verified and circuit hierarchical information on the semiconductor circuit to be verified. Thereafter, a plurality of circuit portions having the same operation pattern and the same hierarchical state in the semiconductor circuit to be verified are retrieved based on the operation information, the circuit hierarchical information, and the circuit diagram data. Then, the specifications in the condition information are individually designated for only one circuit portion among the retrieved plurality of circuit portions so that the condition verification is executed for only circuit elements included in the one circuit portion.

In the above circuit operation verifying method, preferably, low-precision, high-speed operation simulation is executed for the semiconductor circuit to be verified using the input patterns, to prepare operation information on the circuit elements of the semiconductor circuit to be verified and circuit hierarchical information on the semiconductor circuit to be verified. Thereafter, a plurality of circuit portions having the same operation pattern and the same hierarchical state in the semiconductor circuit to be verified are retrieved based on the operation information, the circuit hierarchical information, and the loaded circuit diagram data. Then, the retrieved plurality of circuit portions are united into one circuit portion, to reduce the circuit diagram data.

The circuit operation verifying apparatus of the present invention is a circuit operation verifying apparatus for verifying that each of a number of circuit elements of a semiconductor circuit in layout design satisfies specifications. The apparatus includes: loading means for loading condition information as electrical specifications on voltages and currents applied to the circuit elements, circuit diagram data representing connection information of the semiconductor circuit to be verified, and input patterns of voltages and currents used for circuit operation simulation with respect to time; operation simulation means for simulating operation of the semiconductor circuit to be verified while computing voltage values or current values with respect to time at the circuit elements of the semiconductor circuit to be verified based on the circuit diagram data and the input patterns loaded by the loading means and storing the computed values in a memory; and verification means for verifying that the circuit elements of the semiconductor circuit to be verified satisfy the specifications in the loaded condition information using the voltage values or the current values at the circuit elements stored in the memory.

Preferably, the above circuit operation verifying apparatus further includes: waveform display means for displaying results of the operation simulation of the semiconductor circuit to be verified performed by the operation simulation means; and design means used for circuit design or layout design of a semiconductor circuit, wherein the results of the condition verification of the semiconductor circuit to be verified performed by the verification means are displayed on the waveform display means or the design means.

Thus, according to the present invention, during operation simulation of a semiconductor circuit to be verified, whether or not circuit elements constituting the semiconductor circuit to be verified satisfy voltage specifications or current specifications is verified every time voltage or current computation results are stored in a memory at infinitesimal time intervals. Therefore, with the use of data stored in the memory that enables high-speed read/write, the condition verification of the semiconductor circuit to be verified can be executed at high speed, and this shortens the verification time. Moreover, since it is not necessary to record analysis data (voltage values, etc.) obtained from the operation simulation in a large-capacity hard disk as conventionally required, the verification can be executed using an inexpensive computation system.

According to the present invention, electrical specifications representing the current density and the heat generation amount are set as the condition information. Therefore, the degree of concentration of the current density and the current-related heat generation phenomenon can be analyzed from the current values obtained from the operation simulation. By grasping the heat generation state of the semiconductor circuit to be verified from the analysis results, optimum design for currents and heat is possible. It is also possible to avoid any heat-related failure that may otherwise be generated. Moreover, since the verification precision is high compared with manual verification, design quality improves.

According to the present invention, time specifications, such as the frequency of violation against the electrical specifications and the allowable time period, are set as the condition information. The allowable time period indicates that if a violating state lasts for only a short time period equal to or less than the designated allowable time period, this violating state is neglected. With the above time specifications, it is possible to verify the relationship between the applied voltage and the application time in the case of deterioration of a gate oxide film of an n-channel MOS transistor, for example.

According to the present invention, the results of the condition verification are displayed on a waveform display apparatus displaying the results of the operation simulation. Therefore, a violating position can be spotted on the waveform representing the results of the operation simulation. In addition, when the results of the condition verification are displayed on a design apparatus used for circuit design or layout design of a semiconductor circuit, a violating circuit element, a violating node, a violating position on the layout, a pattern of violation, and the like may be displayed. This provides good visibility and enables highly efficient check of the verification.

According to the present invention, a verification period during which the verification is executed, or a non-verification period during which no verification is executed, is designated. By this limitation of the verification period, it is possible to complete the condition verification in a short time.

According to the present invention, the specifications in the condition information may be designated commonly for all circuit elements constituting the semiconductor circuit to be verified, or designated individually for the respective circuit elements. Therefore, by selecting the common designation or the individual designation as required, it is possible to attain both improvement of the verification precision and shortening of the verification time.

According to the present invention, condition verification is executed for only one of a plurality of circuit portions having the same operation pattern and the same hierarchical state in the semiconductor circuit to be verified. This reduces the number of circuit elements to be subjected to condition verification, and thus increases the speed of the condition verification by the amount of this reduction.

According to the present invention, the circuit diagram data of a semiconductor circuit to be verified is reduced so that a plurality of circuit portions having the same operation pattern and the same hierarchical state are united into one circuit portion. This increases the speed of the condition verification of the semiconductor circuit to be verified by the amount of this reduction.

DESCRIPTION OF THE PREFERRED EMBODIMENTS

Hereinafter, preferred embodiments of the present invention will be described with reference to the accompanying drawings.

Embodiment 1

Figure 1:
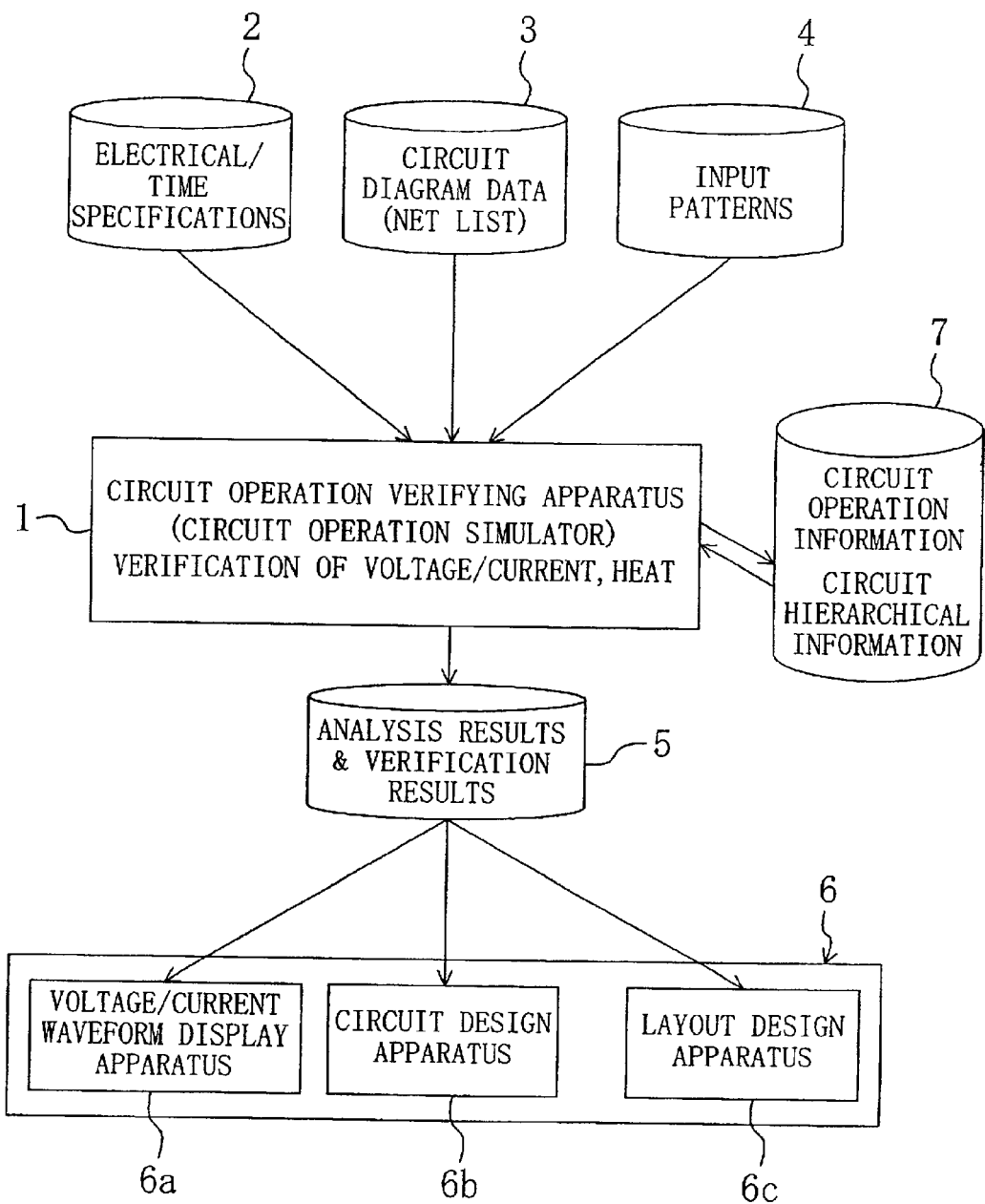
FIG. 1 is an illustration of a circuit operation verifying system including a circuit operation verifying apparatus of Embodiment 1 of the present invention.

FIG. 1 shows an entire system including a circuit operation verifying apparatus of an embodiment of the present invention. The circuit operation verifying apparatus, denoted by the reference numeral 1, is an apparatus equipped with electronics design automation (EDA) software for simulating circuit operation that runs on a computer such as an EWS and a PC.

Into the circuit operation verifying apparatus 1, condition information 2, circuit diagram data (a net list) 3, and input patterns are input. The condition information 2 includes description of electrical and time specifications of circuit elements. The circuit diagram data 3 includes connection information on a semiconductor circuit to be verified. The input patterns 4 are patterns of applied voltages and currents required for operation simulation. Based on these three types of input data, the circuit operation verifying apparatus 1 verifies whether or not voltages applied to input terminals of respective circuit elements of the semiconductor circuit to be verified, as well as currents flowing through nodes thereof, satisfy the electrical or time specifications, and detects a position (circuit element) violating the specifications, if any, while executing the operation simulation. The detailed procedure of this verification, which is shown as a flowchart in FIG. 2, will be described later.

As shown in FIG. 1, upon termination of the verification, simulation analysis results and verification results 5 are provided. Based on the analysis and verification results 5, whether or not there exists a circuit element violating the electrical or time specifications and, if exists, the violating position are checked. The violating position spotted on the circuit diagram is displayed on a display 6 and checked. The display 6 includes a voltage/current waveform display apparatus (waveform display means) 6a, a circuit design apparatus (design means) 6b, and a layout design apparatus (design means) 6c. The voltage/current waveform display apparatus 6a displays waveforms of voltages or currents as a result of the operation simulation on the display. The circuit operation verifying apparatus 1 controls the voltage/current waveform display apparatus 6a so that a waveform relating to the violating position among the voltage or current waveforms is automatically displayed on the display of the computer. This improves visibility of the violating position and thus facilitates the checking of the verification results. Also, to display information on the violating circuit element, CAD may be used. The CAD is software used for circuit design and layout design with the circuit design apparatus 6b and the layout design apparatus 6c. Using this software, violation information and information on the violating circuit element can be easily displayed on a display of a computer. In this way, the violating position can be clearly recognized from the circuit diagram and the layout.

Figure 2:
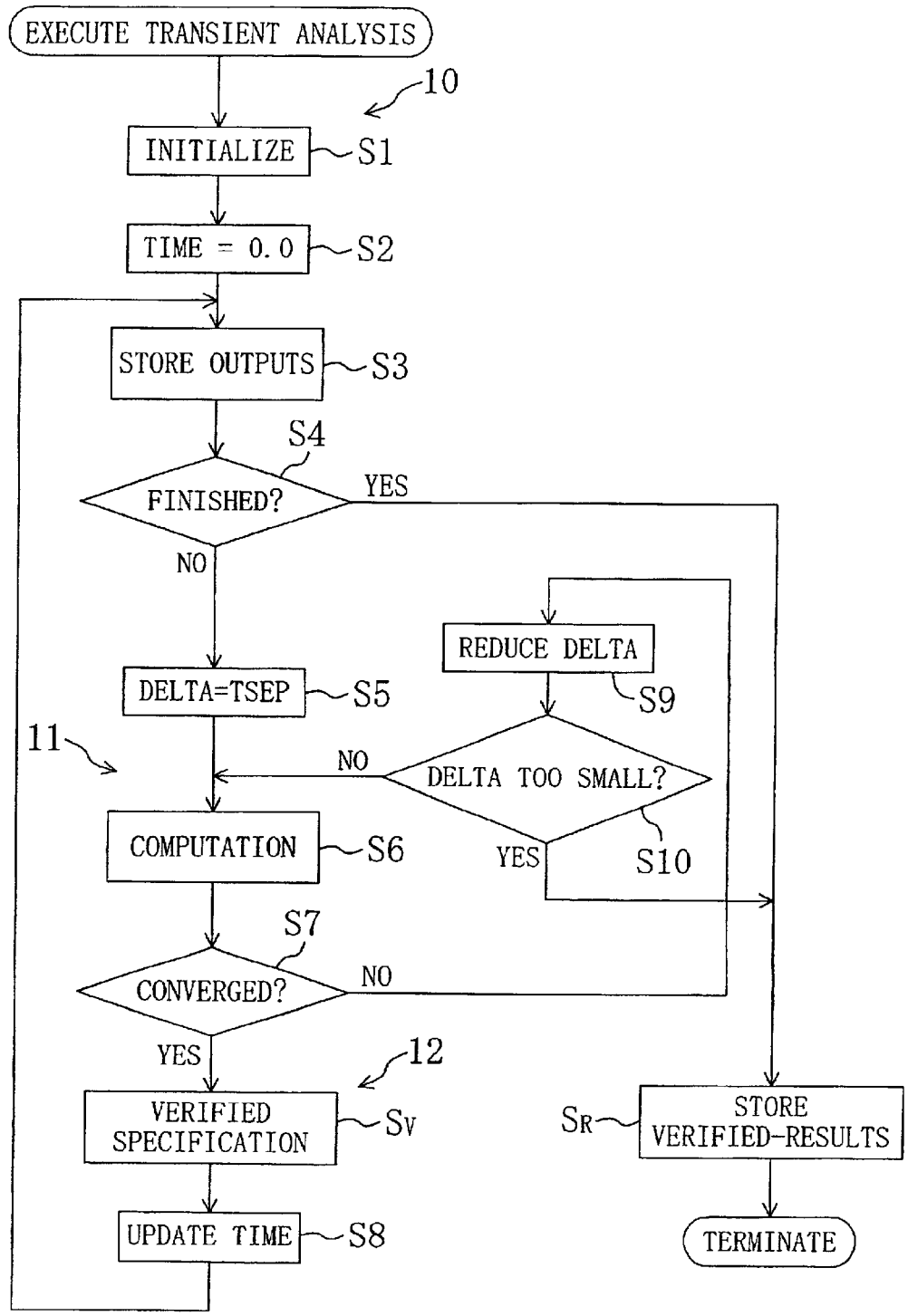
FIG. 2 is a flowchart showing details of a circuit operation verifying method executed by the circuit operation verifying apparatus of Embodiment 1.
Figure 11:
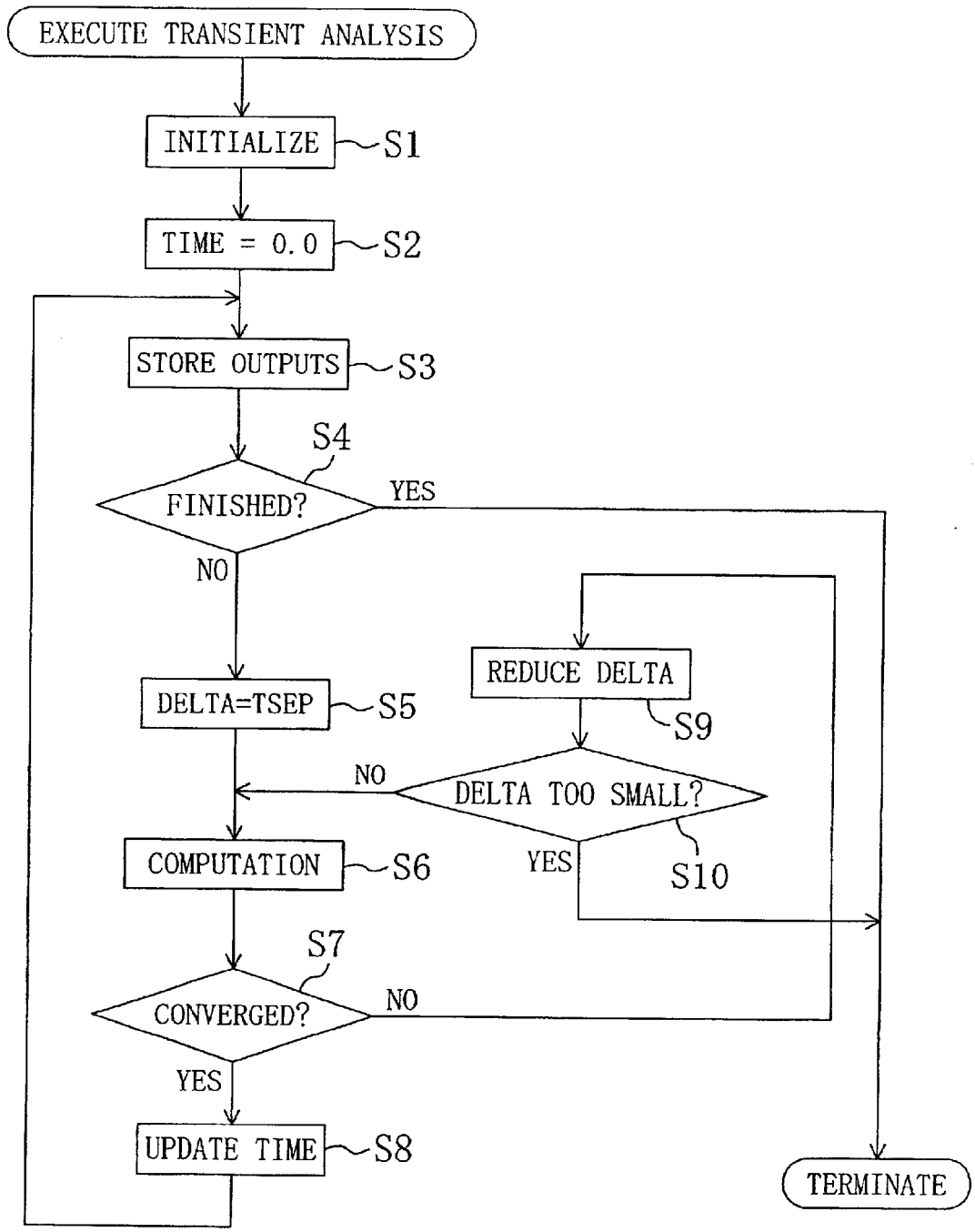
FIG. 11 is a flowchart showing a procedure of conventional operation simulation.
Figure 12:
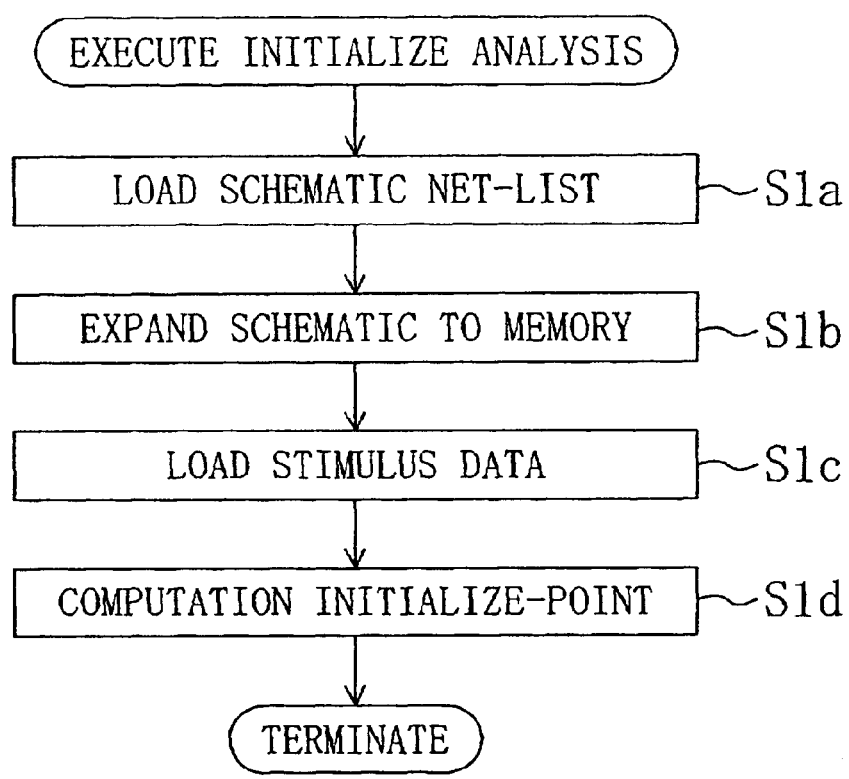
FIG. 12 is a view showing details of initialization in step S1 in the flowchart of FIG. 11.
Figure 13:
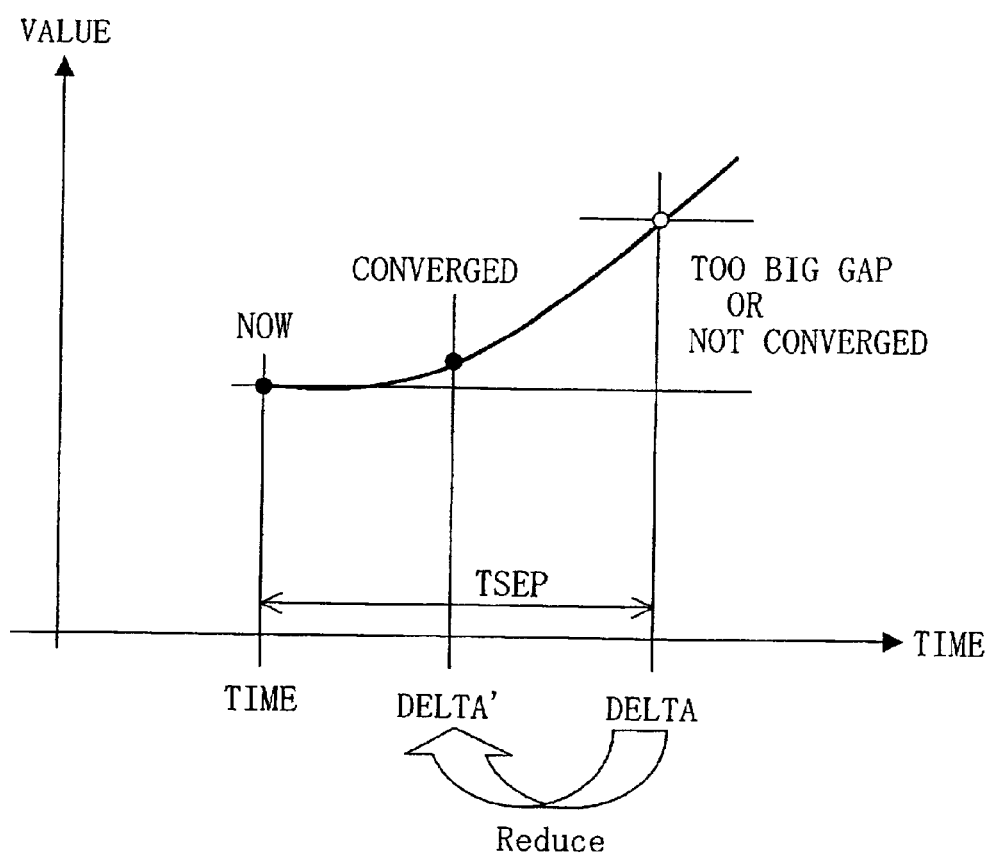
FIG. 13 is a view showing the relationship between the time step value DELTA and the convergence of computation results of the voltage value in the conventional operation simulation.

Next, the flow of processing of the circuit operation verifying apparatus 1 shown in FIG. 2 will be described. The processing flow in FIG. 2 is different from the conventional processing flow shown in FIG. 11 in that step SV for condition verification (Verified specification) is incorporated in the operation simulation after step S7 for determining convergence and that step SR for storing condition verification results in a file (Store verified-results) is added before the termination. According to the procedure shown in FIG. 2, condition verification is executed in parallel with the operation simulation. Therefore, the condition verification can be executed using analysis data of voltages or currents in the expanded state in the memory. This will be described below in detail.

Figure 3:
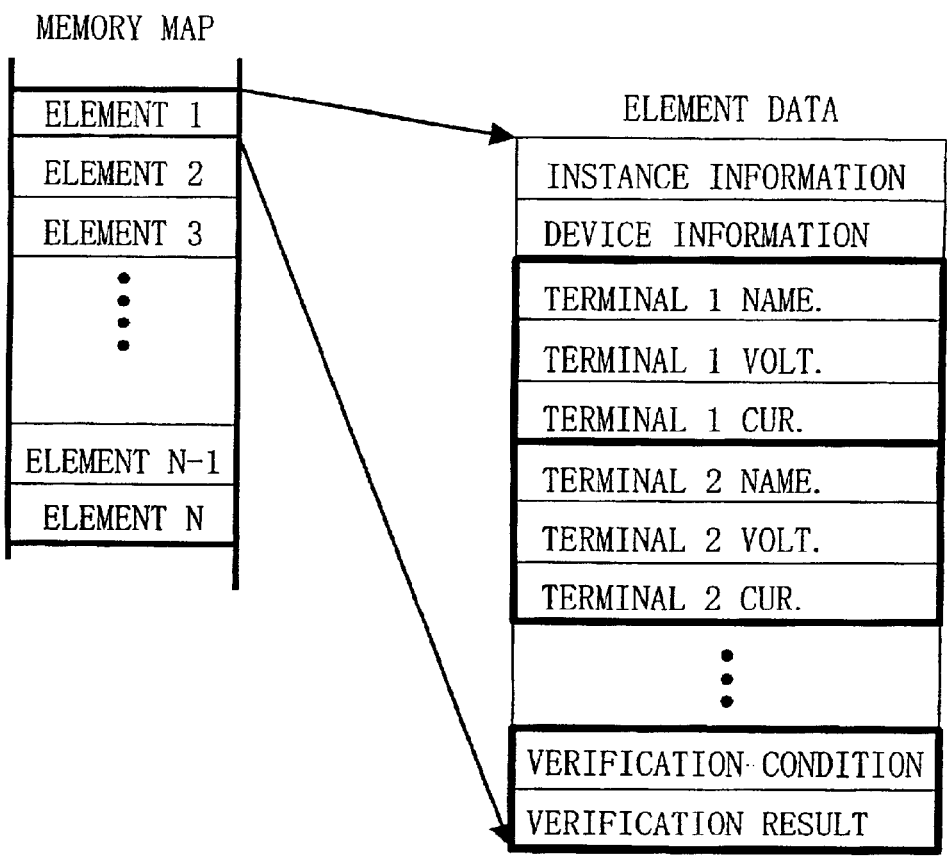
FIG. 3 is an illustration of data construction for a circuit element expanded in a memory.

FIG. 3 shows a data structure for a circuit element expanded to a memory. This data structure, which is provided for each circuit element, includes instance information on the circuit element, device information, the name, voltage value, current value of each terminal of the circuit element, specification information for condition verification (Verification condition), and results of the condition verification (Verification result). The instance information is information for distinguishing one circuit element from others, which also includes information representing a hierarchical structure of the circuit. The device information includes the size of the device, such as a gate length and a gate width when the device is a MOS transistor, for example, and is used as device parameters in computation of the operation simulation. In the fields of the name, the voltage value, and the current value of each terminal, voltage and current values at the terminal obtained as a result of the operation simulation are written. The specification information for condition verification includes information on whether or not the circuit element in question is an object to be verified and details of verification conditions. Results of the condition verification are written in the field of results of the condition verification only when the circuit element in question is an object to be verified. The results of the condition verification include values of the verification results corresponding to the verification conditions (for example, a potential difference between two terminals), the frequency of violation, the time length of violation, and the start and end times of violation. The field of results of condition verification is not provided when the circuit element in question is not an object to be verified.

Figure 4:
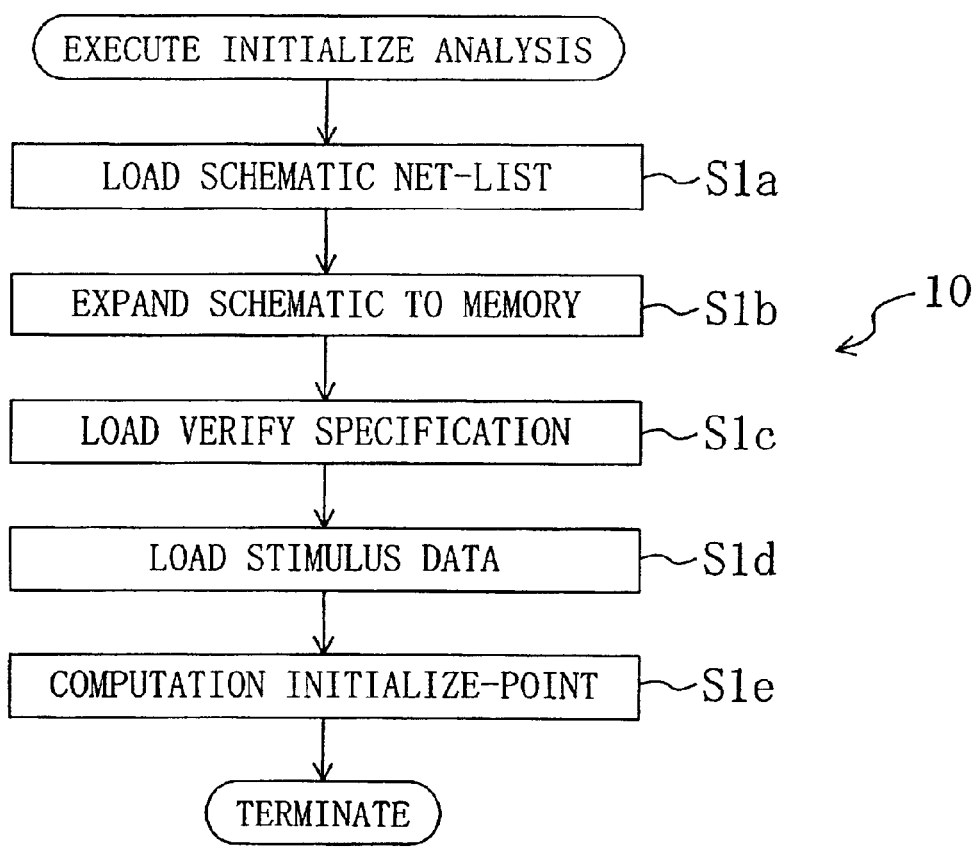
FIG. 4 is a flowchart showing details of initialization in step S1 in the circuit operation verifying method shown in FIG. 2.

The expansion of the data on each circuit element to the memory is executed during the initialization in the procedure of the simulation shown in FIG. 2. This initialization will be described in detail with reference to FIG. 4. Referring to FIG. 4, first in step S1$a$, the circuit diagram data stored as a file in a hard disk is loaded into the circuit operation verifying apparatus 1 (Load schematic net-list). In step S1$b$, the circuit diagram data is expanded to the memory in the form of the data structure shown in FIG. 3 (Expand schematic to memory). In step S1$c$, specification information for condition verification is loaded (Load verify specification) and registered in the field for specification information for condition verification (verification condition) in the data structure shown in FIG. 3 for each circuit element. Finally, input patterns are loaded (Load stimulus data) in step S1$d$, and initial values are analyzed in step S1$e$ (Computation initialize-point). Thus, the initialization is terminated.

In the processing flow shown in FIG. 2, step S1, in particular, steps S1$a$, S1$c$, and S1$d$ in FIG. 4 as sub-steps of step S1, constitute a loading means 10. That is, the loading means 10 loads the circuit diagram data (net list), the condition information, and the input patterns. Steps S2 through S10 of the processing flow constitute an operation simulation means 11. That is, the operation simulation means 11 computes the voltage and current values at each circuit element every time step value DELTA based on the circuit diagram data and the input data, and stores the computed values in the fields for storing the voltage and current values in the memory shown in FIG. 3, while simulating the operation of the semiconductor circuit to be verified. Also, step SV of the processing flow constitutes a verification means 12. The verification means 12 verifies whether or not each element of the semiconductor circuit to be verified satisfies the specifications in the specification information for condition verification (Verification condition) loaded to the memory as shown in FIG. 3 using the voltage and current values stored in the voltage and current storing fields in the memory.

Figure 5A:
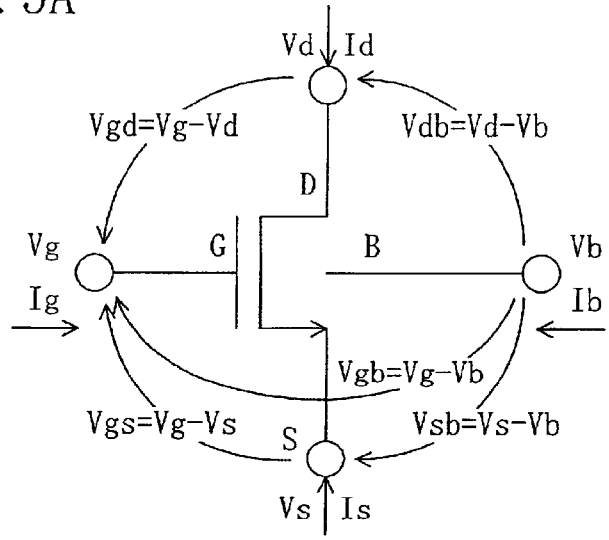
FIG. 5A is a view showing the relationship of potential differences between terminals of an NMOS transistor.

Next, specific condition information representing the electrical and time specifications of circuit elements, as well as details of the verification, will be described. As an example, verification of applied voltages of an NMOS transistor will be described with reference to FIGS. 5A and 5B. FIG. 5A shows circuit codes of an NMOS transistor. The NMOS transistor includes four terminals, a gate (G) terminal, a drain (D) terminal, a source (S) terminal, and a substrate (B) terminal, and voltages Vg, Vd, Vs, and Vb are applied to the respective terminals. Inter-terminal voltages are as follows.

Figure 5B:
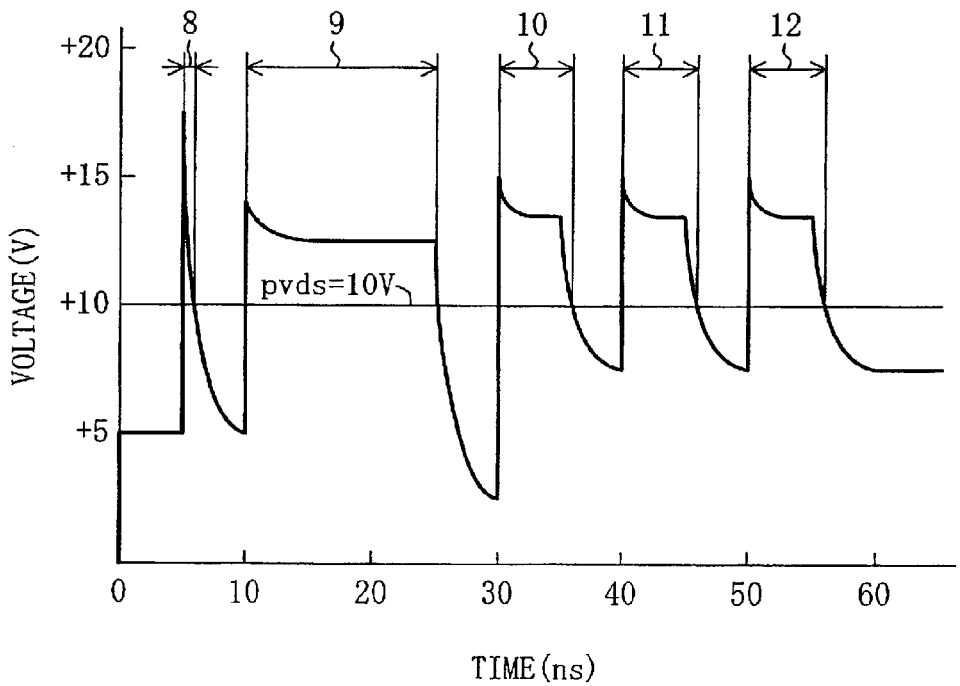
FIG. 5B is a view showing an example of results of condition verification.

Gate-drain voltage Vgd=Vg−Vd
Gate-source voltage Vgs=Vg−Vs
Gate-substrate voltage Vgb=Vg−Vb
Drain-source voltage Vds=Vd−Vs
Drain-substrate voltage Vdb=Vd−Vb
Source-substrate voltage Vsb=Vs−Vb The electrical specifications defining the range of the applied voltages are set as follows. Note that nvgd, nvgs, nvdb, nvds, nvdb, and nvsb denote the respective negative maximum values, and pvgd, pvds, pvgb, pvds, pvdb, and pvsb denote the respective positive maximum values.

nvgd≦Vgd≦pvgd
nvgs≦Vgs≦pvgs
nvgb≦Vgb≦pvgb
nvds≦Vds≦pvds
nvdb≦Vdb≦pvdb
nvsb≦Vsb≦pvsb FIG. 5B shows an example of the results of operation simulation. Specifically, FIG. 5B shows a waveform of the voltage Vds applied between the drain and the source of a certain NMOS transistor. If the electrical specifications for the drain-source voltage Vds are defined as Vds≦+10 V, that is, pvds=10 V, the drain-source voltage Vds in FIG. 5B violates the specifications in the time periods denoted by the reference numerals 8, 9, 10, 11, and 12 in FIG. 5B (hereinafter, such time periods are referred to as violation periods). The circuit operation verifying apparatus 1 detects each of such violation periods and outputs the start and end times and the time length of the violation period, the peak voltage value during the violation period, and the frequency of the violation period, together with information on the circuit element concerned. The verification results of the violation periods 8 and 12 are as follows, for example. In the violation period 8, the start and end times of the violation are 5 ns and 7 ns, respectively, the time length is 2 ns, the peak value is 17.5 V, and the frequency is 1 (first time). In the violation period 12, the start and end times of the violation are 50 ns and 55 ns, respectively, the time length is 5 ns, the peak value is 15 V, and the frequency is 5 (fifth time).

The time specifications will be described. As the time specifications, the start and end times of the verification and the allowable time period of violation are designated. The data of the simulation results shown in FIG. 5B is verified based on the designated time specifications in the following manner. If the start and end times for the violation verification are designated as 10 ns and 50 ns, respectively, the violation verification is executed for the period from time 10 ns to time 50 ns. In this case, the violation periods 9, 10, and 11 are detected. If the allowable time period of violation is designated as 10 nm, only the violation period 9 is output as the verification results.

The verification of whether the electrical specifications and the time specifications are satisfied or violated described above is executed in step SV for condition verification (Verified specification) during the circuit operation simulation in steps S1 through S10 shown in FIG. 2 concurrently with the circuit operation simulation. More specifically, voltage and current values at respective terminals obtained from the operation simulation are stored in the fields of voltage and current values for the respective terminals of the circuit element concerned (Terminal volt., cur.) as the information of the circuit element shown in FIG. 3, and condition verification is executed using the stored voltage and current values, as well as the amount of heat generation computed from these values. Since data in the memory can be read/written at high speed, the condition verification proceeds at high speed.

The condition verification of circuit elements is executed during the operation simulation as described above. Therefore, the work efficiency is good compared with the conventional condition verification executed after completion of circuit operation simulation. In addition, in this embodiment, the condition verification is executed using the circuit element information shown in FIG. 3 expanded to the memory. This eliminates the necessity of accumulating analysis data used for the condition verification as conventionally required. Therefore, good data use efficiency is obtained.

Moreover, in the case of an LSI using a high voltage inside a chip, such as those including a flash memory and a liquid crystal driver, the following advantage is obtained. In detection of the maximum voltage value applied to a circuit element, only data required for the detection among the analysis data obtained from the operation simulation may be output as analysis results. This enables efficient verification of the applied voltage based on the electrical specifications. As a result, it is possible to avoid comparatively easily design mistake that may otherwise cause breakdown and the like of a circuit element, compared with the conventional technique.

The voltage specifications and the time specifications in combination may be used to define the conditions for voltages applied to an oxide film between the gate and the substrate of a MOSFET and an oxide film such as a capacitance element thereof, as well as the application time of the voltages. By using these specifications, it is possible to execute condition verification of the circuit element considering additionally the deterioration characteristics of the gate oxide film of the MOSFET.

In this embodiment, also, the period during which the verification is executed can be specified by designating the start and end times of the verification. By this designation of verification period, it is possible to omit execution of the verification outside the designated verification period. This increases the speed of the verification. Alternatively, the start and end times from and until which the condition verification is not executed may be designated. A plurality of items of electrical and time specifications may be set, or the electrical and time specifications may be set every circuit block or every circuit element. In the latter case, delicate condition analysis for the circuit blocks or the circuit elements is possible. In addition, by designating a specific region of circuit that should be subjected to the condition verification out of the entire circuit, it is possible to omit verification of circuit elements for which verification is unnecessary. This shortens the processing time.

Next, condition verification based on the electrical specifications on currents will be described using the NMOS transistor shown in FIG. 5A. Assume that a gate current Ig, a drain current Id, a source current Is, and a substrate current Ib flow to the four terminals of the NMOS transistor. As in the case of the voltage specifications described above, the electrical specifications defining the applied currents are set as follows.

$nig \leq Ig \leq pig$
$nid \leq Id \leq pid$
$nis \leq Is \leq pis$
$nib \leq Ib \leq pib$ By defining the condition information on currents as described above, the currents flowing to each circuit element can be verified. Verification of current values may not be necessary because the drain current Id and the source current Is of a transistor element are necessarily determined from the current driving capability of the transistor, that is, ON resistance of the transistor. However, there is a phenomenon that the substrate current Ib flows from the drain to the substrate when a somewhat high drain voltage is applied. By verifying the current values, the position at which this phenomenon occurs can be automatically specified when an analog circuit sensitive to currents is designed. In this case, therefore, good design efficiency is obtained.

By verifying current values in association with layout information of a semiconductor circuit, it is possible to verify the electrical specifications on the current density and the heat generation amount. The current density is determined from the current value obtained from the operation simulation and information extracted from the layout information such as the width of inner interconnections, and the number and shape of interconnection contacts. By verifying the current density, it is possible to specify a position of breaking of the interconnections due to electromigration caused by an excess current, and a supply-voltage drop position and a ground-voltage rise position that may cause troubles in the supply and ground interconnections. Therefore, in association with the three types of data, that is, the analysis results of the operation simulation, the verification results of element specifications, and the layout information, it is possible to recognize a position violating the electrical specifications on the current density from the circuit diagram and the layout.

In addition, it is possible to provide in-chip heat generation distribution by computing the heat generation energy and the heat generation amount from the current values obtained from the operation simulation and associating the computed values with the layout information. Using the heat generation distribution, thermal design of an LSI is possible. It is also possible to specify a position in an LSI at which the transistor characteristics deteriorate due to temperature rise inside the LSI. This analysis of the heat generation amount is usable for design of an LSI that consumes a large amount of current and an LSI that operates at a high frequency.

In this embodiment, the condition verification of currents is also executed concurrently with the operation simulation. Therefore, good work efficiency is obtained. Moreover, since the condition verification in this embodiment is sequential processing, the results of the condition verification can be checked at any time during the operation simulation.

Embodiment 2

A circuit operation verifying method and apparatus of Embodiment 2 of the present invention will be described. In this embodiment, the time required for condition verification is shortened in consideration of the hierarchical structure of a semiconductor circuit.

Figure 6:
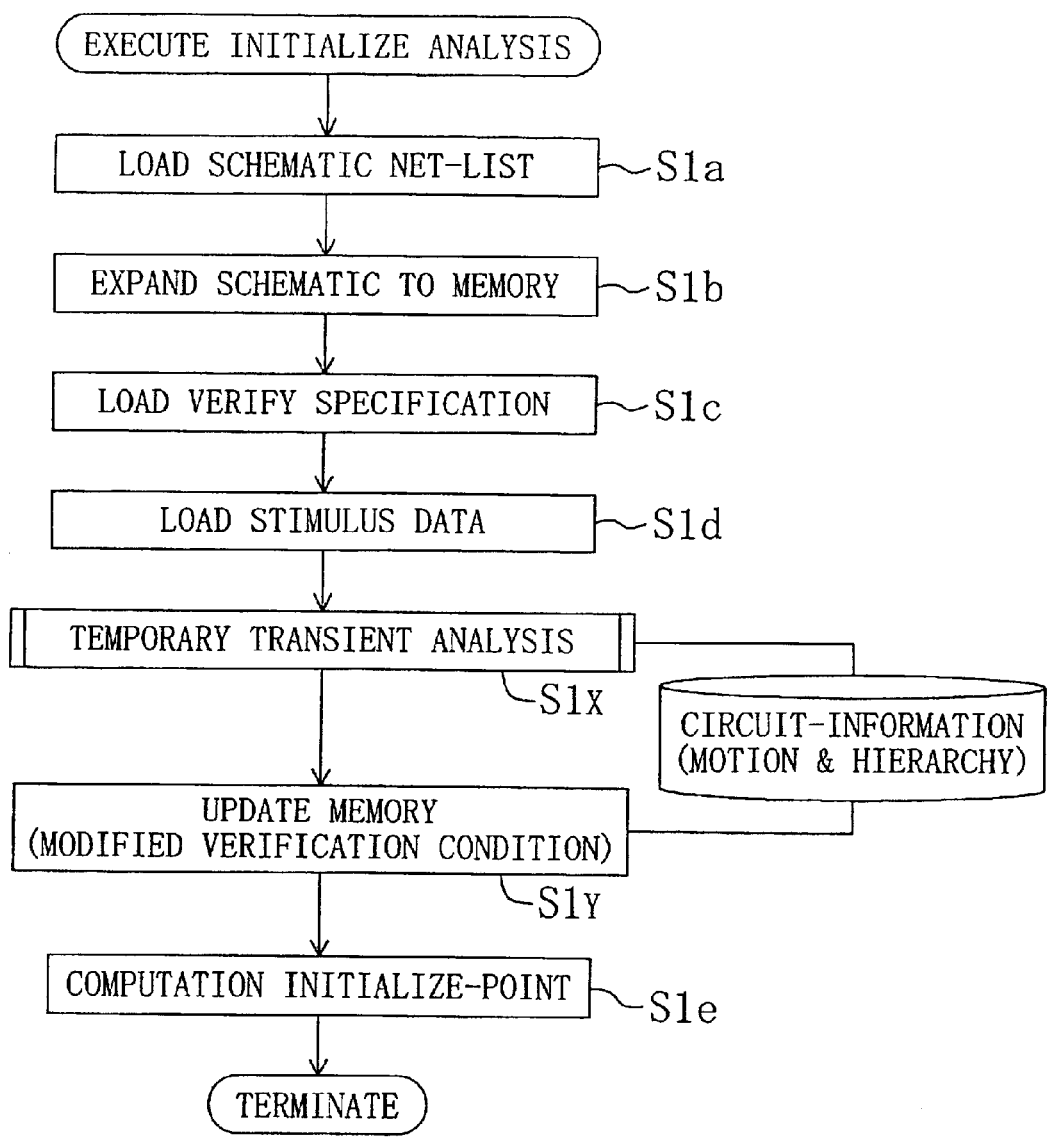
FIG. 6 is a flowchart showing details of initialization in a circuit operation verifying method of Embodiment 2 of the present invention.

The procedure of the circuit operation verification of this embodiment is the same as the entire processing flow shown in FIG. 2, except for the initialization in step S1. The initialization in this embodiment is shown in FIG. 6 in detail. Referring to FIG. 6, first, circuit diagram data is loaded in step S1a, and stored in a memory as shown in FIG. 3 in step S1b. In step S1c, information on condition verification is loaded and registered in the "Verification condition" field shown in FIG. 3. Up to this stage, the setting has been done for condition verification for all circuit elements.

Upon completion of the above processing, in step S1d, input patterns are loaded, and in step S1X, temporary simulation (Temporary transient analysis) is executed. In the temporary simulation, which uses the same program as that used for the ultimate operation simulation (Transient analysis), the operation states or the non-operation states of all circuit elements are determined from the status of signal transmission based on the input patterns, to prepare operation information for the respective circuit elements. The operation information for the respective circuit elements is obtained simply by extracting the switching status of the circuit elements. Accordingly, in the temporary simulation in step S1X, the time step value DELTA for the simulation may be set at a large constant value TSEP to speed up the proceeding of the simulation, and/or a simple switch element or the like may be used as the circuit element, to execute low-precision, high-speed simulation. By executing such temporary simulation, circuit operation information is prepared.

Thereafter, in step S1Y, condition verification is individually designated based on the circuit operation information obtained in the preceding step. In this individual designation processing, circuit hierarchical information representing the hierarchical structure of the circuit is generated based on the circuit operation information prepared from the temporary simulation described above, the circuit grasped from the circuit diagram data, and connection information of the circuit elements constituting the circuit. Based on the circuit hierarchical information, the circuit operation information, and the electrical or time specifications shown in FIG. 1, a plurality of circuit elements having the same operation pattern and the same hierarchical state are recognized. Condition verification is executed for only one of the plurality of circuit elements that have the same hierarchical state and operate in the same manner. For this purpose, therefore, the specification information for condition verification (Verification condition) shown in FIG. 3 is kept unchanged for the circuit element to be subjected to the condition verification, to keep the condition verification effective. On the contrary, for the other circuit elements that are not subjected to the condition verification, the specification information for condition verification is rewritten to be ineffective (Update memory). In this way, the specification information for condition verification is updated to effect individual designation of condition verification.

Upon completion of the above processing, in step S1e, operation point analysis is executed (Computation initialize point). The process then returns to the main processing flow shown in FIG. 2, for execution of the ultimate circuit operation simulation (steps S1 through S10) and the condition verification (steps SV and SR) according to this processing flow.

Figure 7A:
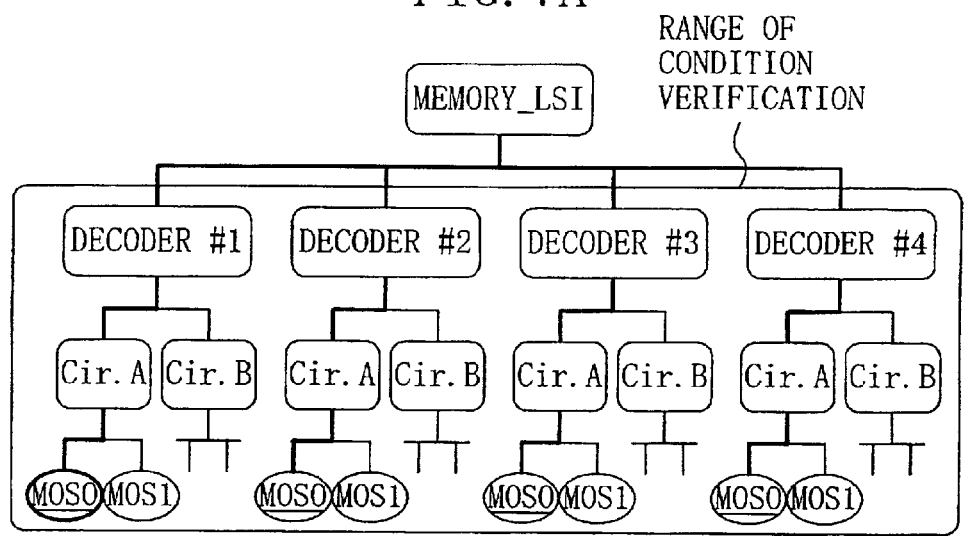
FIG. 7A is a view of a specific circuit structure of a semiconductor circuit to be verified.
Figure 7B:
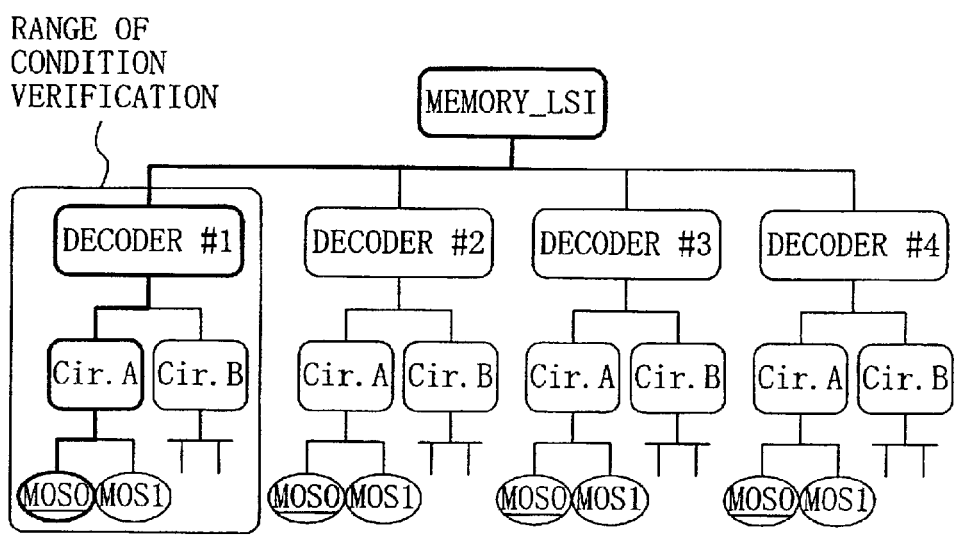
FIG. 7B is a view showing the range of verification performed when the circuit operation verifying method of Embodiment 2 is applied to the semiconductor circuit shown in FIG. 7A.

A specific example of the individual designation described above will be described. FIG. 7A illustrates a circuit construction of a memory LSI. The illustrated memory LSI includes four decoders having the same circuit structure. Each of the decoders is constructed of two circuits A and B. Each of the circuits A and B is constructed of MOSFET elements MOS0 and MOS1. In general, the range of circuit elements to be verified when condition verification is executed for the memory LSI covers the entire memory LSI as shown in FIG. 7A. This means that condition verification is executed for a plurality of circuit elements having the same operation pattern and the same hierarchical state. In reality, however, in the memory LSI shown in FIG. 7A, the circuits and the circuit elements connected with each other via bold lines operate in the same manner, and the underlined circuit elements MOS0 operate in the same manner and are in the same hierarchical state. In this embodiment, such hierarchical information is provided as the circuit hierarchical information generated in step S1Y in FIG. 6. Therefore, in this embodiment, as shown in FIG. 7B, only one decoder #1 among the four decoders #1 to #4 having the same circuit structure is subjected to condition verification. The range of the condition verification is therefore limited. In this way, since the circuit scale to be verified is reduced to ¼, speedup of the verification is possible.

Embodiment 3

A circuit operation verifying method and apparatus of Embodiment 3 of the present invention will be described. In this embodiment, initialization shown in FIG. 8, which is partly different from the initialization shown in FIG. 6, is performed.

Figure 8:
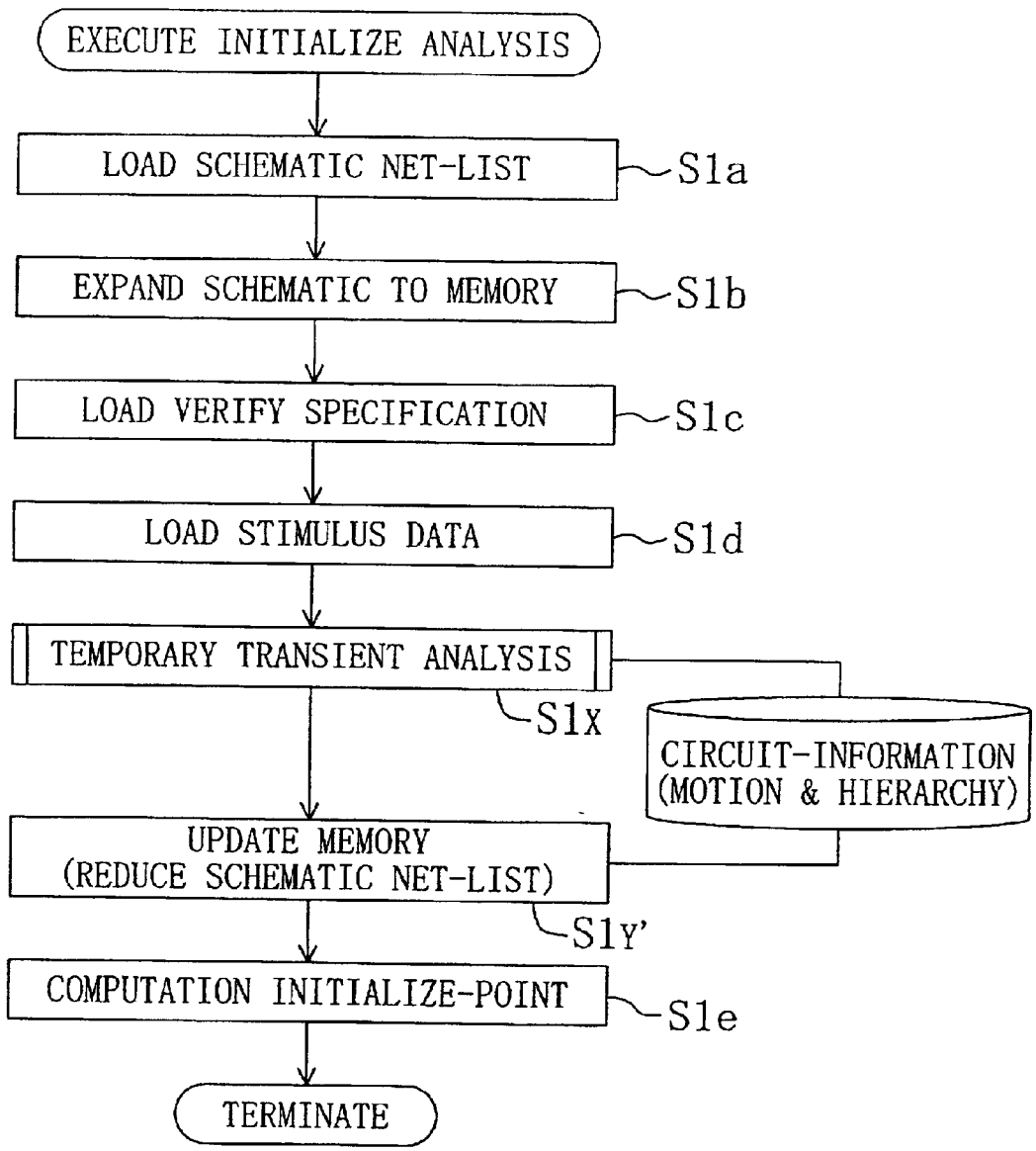
FIG. 8 is a flowchart showing details of initialization in a circuit operation verifying method of Embodiment 3 of the present invention.

In the initialization shown in FIG. 8, reduction of the circuit diagram data in the individual designation in step S1Y' (Update memory) after the temporary simulation (Temporary transient analysis) in step S1X is realized differently from the initialization shown in FIG. 6. Specifically, the reduction in this embodiment is realized by remaining only one of a plurality of circuit portions operating in the same manner and having the same circuit construction while deleting the other circuit portions from the circuit diagram data stored in the memory.

In this embodiment, therefore, as in Embodiment 2, circuit operation information and circuit hierarchical information are generated from temporary circuit operation simulation. From these two units of information, a plurality of circuit portions operating in the same manner and having the same circuit construction are retrieved only one of the plurality of circuit portions retrieved is remained while the other circuit portions are deleted. The new circuit diagram data therefore includes only the remained circuit portion. The ultimate circuit operation simulation and the condition verification are executed using this new circuit diagram data. Therefore, since the scale of the new circuit diagram data has been reduced compared with the original circuit diagram data, speedup of the ultimate verification processing and the condition verification is possible.

Figure 9A:
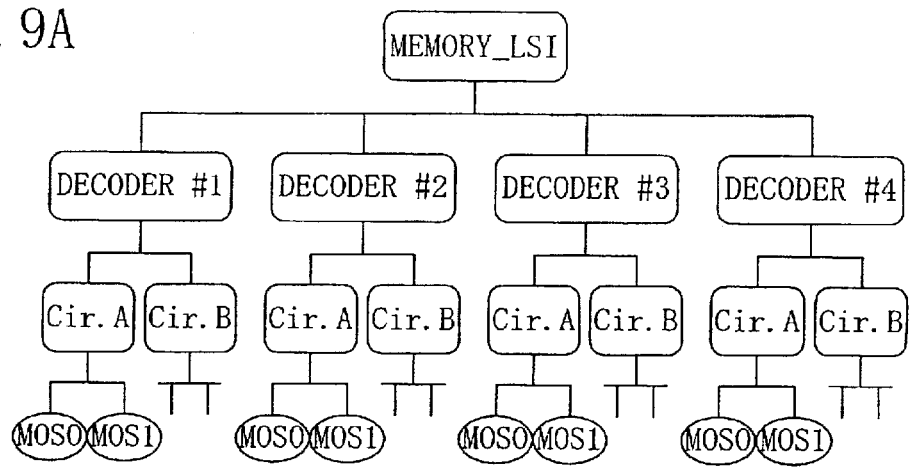
FIG. 9A is a view of a specific circuit structure of a semiconductor circuit to be verified.
Figure 9B:
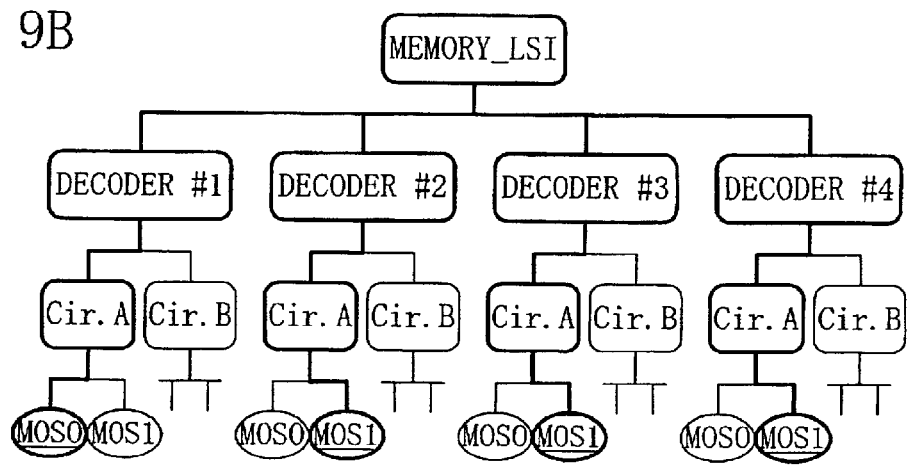
FIG. 9B is a view showing analysis results of the hierarchical structure of the semiconductor circuit shown in FIG. 9A.

A specific example of the reduction described above will be described with reference to FIGS. 9A to 9C. FIG. 9A illustrates a hierarchical structure of an original circuit construction. By analyzing the circuit operation information and the circuit diagram data, it is found that in three decoders #2, #3, and #4, the circuit elements MOS1 operate in the same manner and have same hierarchical state, as shown in FIG. 9B. In decoder #1, however, the circuit element MOS0 does not operate in the same manner as the circuit elements MOS0 in the other decoders #2, #3, and #4. In FIG. 7B, the circuits connected with each other via bold lines and the underlined circuit elements respectively operate in the same manner. In view of the above, in this embodiment, a new circuit diagram data as shown in FIG. 9C is prepared, where the three decoders #2, #3, and #4 operating in the same manner and having the same hierarchical state have been reduced to only decoder #3, for example.

Figure 9C:
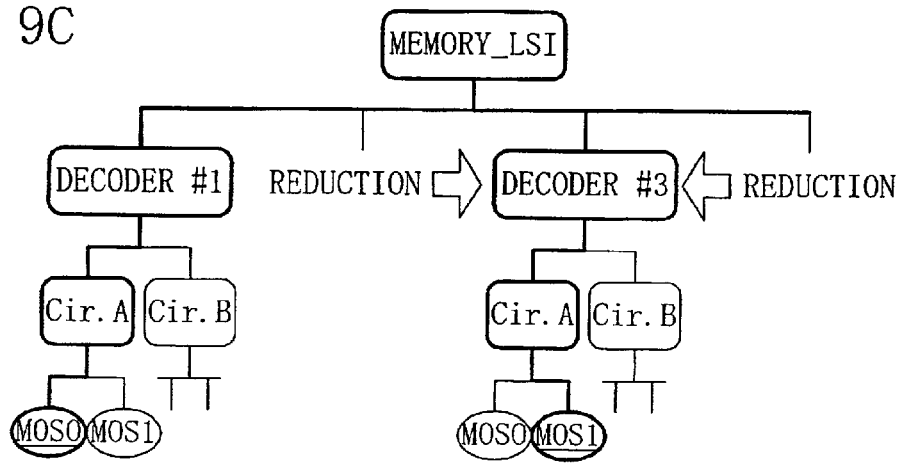
FIG. 9C is a view showing reduction results of the semiconductor circuit shown in FIG. 9A obtained when the circuit operation verifying method of Embodiment 3 is applied to the semiconductor circuit shown in FIG. 9A.
Figure 10:
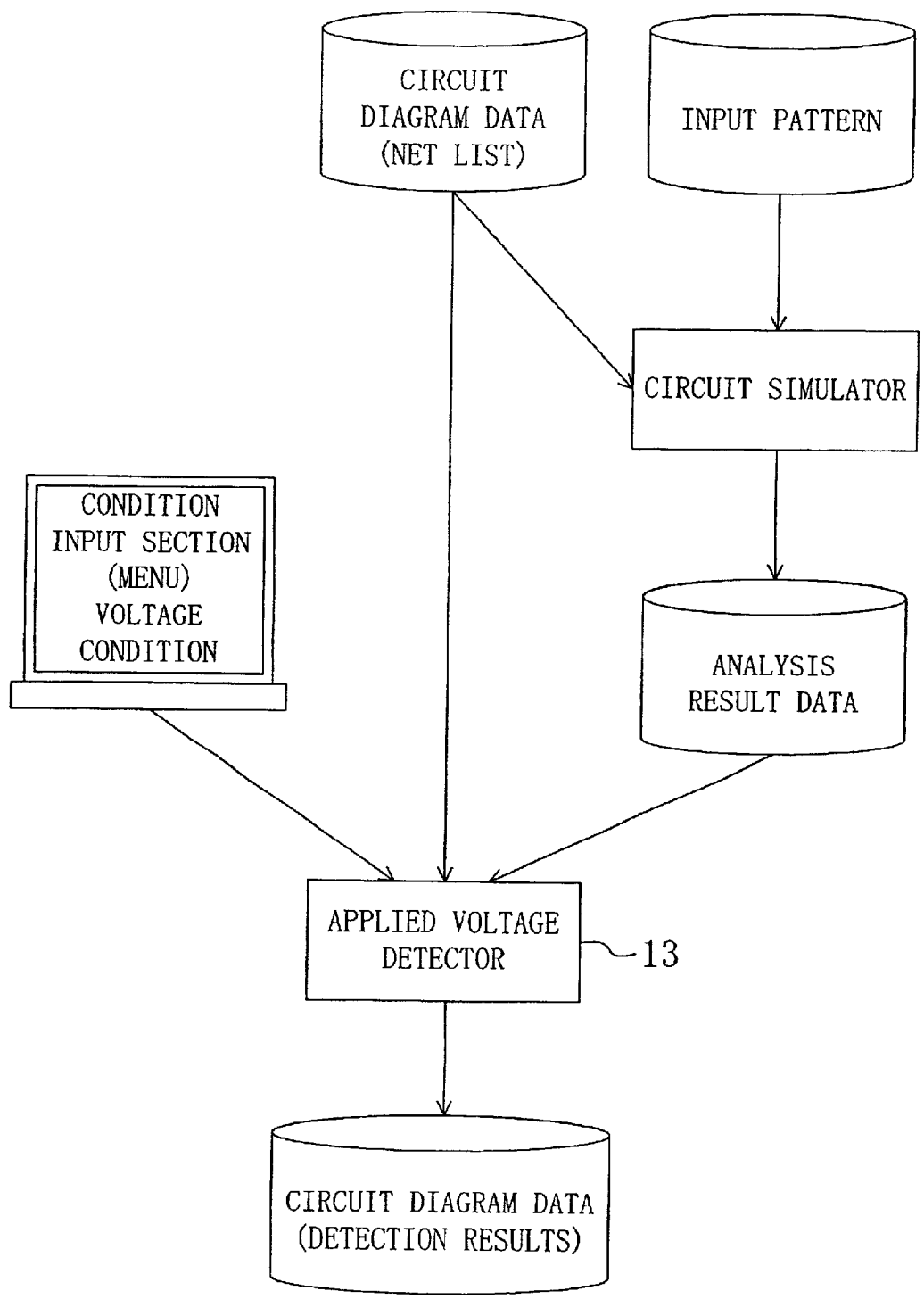
FIG. 10 is an illustration of a conventional circuit operation verifying system including an applied voltage detector.

As described above, since the ultimate circuit operation simulation and the condition verification are executed using the newly-prepared circuit diagram data shown in FIG. 9C, the speed of the verification improves compared with the verification of the entire memory LSI.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A circuit operation verifying method for verifying that each of a number of circuit elements of a semiconductor circuit in layout design satisfies specifications, the method comprising the steps of:

loading condition information of the semiconductor circuit as electrical specifications on voltages and currents applied to the circuit elements, circuit diagram data representing connection information of the semiconductor circuit, and input patterns of voltages and currents used for circuit operation simulation with respect to time;

simulating operation of the semiconductor circuit by computing voltage values or current values with respect to time of the circuit elements of the semiconductor circuit being based on the loaded circuit diagram data and input patterns, said simulating operation being performed at each of a plurality of specific times which are incrementally increasing, and storing the computed values in a memory after each simulating operation;

verifying that the circuit elements of the semiconductor circuit satisfy the loaded condition information using the voltage values or the current values of the circuit elements stored in the memory, said verifying step being performed after each simulating operation; and calculating a next specific time used for a next simulating step and a next verification step by adding an infinitesimal time to the specific time after the verifying step, wherein the simulating step, the verifying step and the calculated step are performed repeatedly, and wherein a low-precision, high-speed operation simulation is executed for the semiconductor circuit using the input patterns, to prepare operation information on the circuit elements of the semiconductor circuit and circuit hierarchical information on the semiconductor circuit.

2. The method of claim 1, wherein the condition information includes time specifications representing the frequency of violation against the electrical specifications or the time period for which a violation state is allowable, and whether or not the frequency of violation or the violation allowable time period of each of the circuit elements of the semiconductor circuit satisfy the time specifications being determined using the voltage values or the current values with respect to time of the circuit element stored in the memory.

3. The method of claim 1, wherein upon termination of the operation simulating step and the verification step, results of condition verification are displayed on a waveform display apparatus displaying results of the operation simulation or a design apparatus used for circuit design or layout design of the semiconductor circuit.

4. The method of claim 1, wherein a verification period during which a condition verification is to be executed for the semiconductor circuit or a non-verification period during which no condition verification is to be executed is designated; and the condition verification for the semiconductor circuit is executed during the verification period.

5. The method of claim 1, wherein the specifications in the condition information are commonly designated for all the circuit elements of the semiconductor circuit, or individually designated for the respective circuit elements.

6. A circuit operation verifying method for verifying that each of a number of circuit elements of a semiconductor circuit in layout design satisfies specifications, the method comprising the steps of:

loading condition information of the semiconductor circuit as electrical specifications on voltages and currents applied to the circuit elements, circuit diagram data representing connection information of the semiconductor circuit, and input patterns of voltages and currents used for circuit operation simulation with respect to time;

simulating operation of the semiconductor circuit while computing voltage values or current values with respect to time of the circuit elements of the semiconductor circuit based on the loaded circuit diagram data and input patterns and storing the computed values in a memory; and verifying that the circuit elements of the semiconductor circuit satisfy the loaded condition information using the voltage values or the current values of the circuit elements stored in the memory, said verifying step being performed concurrently with said simulating operation, wherein the specifications in the condition information are commonly designated for all the circuit elements of the semiconductor circuit, or individually designated for the respective circuit elements, wherein a low-precision, high-speed operation simulation is executed for the semiconductor circuit using the input patterns, to prepare operation information on the circuit elements of the semiconductor circuit and circuit hierarchical information on the semiconductor circuit, wherein a plurality of circuit portions, each having an operation pattern and a hierarchical state, in the semiconductor circuit are retrieved based on the operation information, the circuit hierarchical information, and the circuit diagram data, and wherein the specifications in the condition information are individually designated for only one circuit portion among the retrieved plurality of circuit portions so that a condition verification is executed for only circuit elements included in the one circuit portion.

7. The method of claim 1, wherein a plurality of circuit portions, each having an operation pattern and a hierarchical state, in the semiconductor circuit are retrieved based on the operation information, the circuit hierarchical information, and the loaded circuit diagram data, and wherein the retrieved plurality of circuit portions are united into one circuit portion, to reduce the circuit diagram data.

8. A circuit operation verifying apparatus for verifying that each of a number of circuit elements of a semiconductor circuit in layout design satisfies specifications, the apparatus comprising:

loading means for loading condition information of the semiconductor circuit as electrical specifications on voltages and currents applied to the circuit elements, circuit diagram data representing connection information of the semiconductor circuit, and input patterns of voltages and currents used for circuit operation simulation with respect to time;

operation simulation means for simulating operation of the semiconductor circuit by computing voltage values or current values with respect to time of the circuit elements of the semiconductor circuit based on the circuit diagram data and the input patterns loaded by the loading means, said simulating operation being performed at each of a plurality of specific times which are incrementally increasing, and storing the computed voltage values or current values in a memory after each simulating operation;

verification means for verifying that the circuit elements of the semiconductor circuit satisfy the specifications in the loaded condition information using the voltage values or the current values of the circuit elements stored in the memory; and calculating means for calculating a next specific time used for the operation simulating means and the verification means by adding an infinitesimal time to the specific time after the verification means performs said verification, wherein the operation simulating means, the verifying means and the calculating means are performed repeatedly, and wherein a low-precision, high-speed operation simulation is executed for the semiconductor circuit using the input patterns, to prepare operation information on the circuit elements of the semiconductor circuit and circuit hierarchical information on the semiconductor circuit.

9. A circuit operation verifying apparatus for verifying that each of a number of circuit elements of a semiconductor circuit in layout design satisfies specifications, the apparatus comprising:

loading means for loading condition information as electrical specifications on voltages and currents applied to the circuit elements, circuit diagram data representing connection information of the semiconductor circuit, and input patterns of voltages and currents used for circuit operation simulation with respect to time;

operation simulation means for simulating operation of the semiconductor circuit while computing voltage values or current values with respect to time of the circuit elements of the semiconductor circuit based on the circuit diagram data and the input patterns loaded by the loading means and storing the computed voltage values or current values in a memory;

verification means for verifying that the circuit elements of the semiconductor circuit satisfy the specifications in the loaded condition information using the voltage values or the current values of the circuit elements stored in the memory, said verification means performing said verification concurrently with said operation simulation means performing said simulating operation, waveform display means for displaying results of the operation simulation of the semiconductor circuit performed by the operation simulation means; and design means used for circuit design or layout design of a semiconductor circuit, wherein verification results determined by the verification means are displayed on the waveform display means or the design means, and wherein a low-precision, high-speed operation simulation is executed for the semiconductor circuit using the input patterns, to prepare operation information on the circuit elements of the semiconductor circuit and circuit hierarchical information on the semiconductor circuit.

10. A circuit operation verifying method for verifying that each of a number of circuit elements of a semiconductor circuit in layout design satisfies specifications, the method comprising the steps of:

loading condition information of the semiconductor circuit as electrical specifications on voltages and currents applied to the circuit elements, circuit diagram data representing connection information of the semiconductor circuit, and input patterns of voltages and currents used for circuit operation simulation with respect to time;

simulating operation of the semiconductor circuit at a plurality of specific times by computing voltage values or current values with respect to time of the circuit elements of the semiconductor circuit based on the loaded circuit diagram data and input patterns, said simulating operation being performed at each of said plurality of specific times;

storing the computed values, which are the result of the simulation step, in a memory after each simulating operation;

verifying that the circuit elements of the semiconductor circuit satisfy the loaded condition information at each specific time using the voltage values or the current values of the circuit elements stored in the memory after each simulating operation; and calculating a next specific time used for a next simulating step and a next verification step by adding an infinitesimal time to the specific time after the verifying step, wherein the simulating step, the verifying step and the calculating step are performed repeatedly, and wherein a low-precision, high-speed operation simulation is executed for the semiconductor circuit using the input patterns, to prepare operation information on the circuit elements of the semiconductor circuit and circuit hierarchical information on the semiconductor circuit.

11. The method of claim 10, wherein the condition information includes electrical specifications representing current density values and heat generation amounts of the circuit elements, the circuit diagram data of the semiconductor circuit includes layout information, and current density analysis and heat generation analysis at positions inside the semiconductor circuit are performed based on the current values of the circuit elements and the layout information stored in the memory.

* * * * *